(12) United States Patent
Lindfors et al.

(10) Patent No.: US 9,753,559 B2
(45) Date of Patent: Sep. 5, 2017

(54) FEEDBACK INTEGRATOR CURRENT SOURCE, TRANSISTOR, AND RESISTOR COUPLED TO INPUT

(71) Applicant: Texas Instruments Incorporated, Dallas, TX (US)

(72) Inventors: Saska J. Lindfors, Espoo (FI); Matti Aaltonen, Veikkola (FI); Jonne J. Lindeberg, Helsinki (FI)

(73) Assignee: Texas Instruments Incorporated, Dallas, TX (US)

( * ) Notice: Subject to any disclaimer, the term of this patent is extended or adjusted under 35 U.S.C. 154(b) by 458 days.

(21) Appl. No.: 13/656,388

(22) Filed: Oct. 19, 2012

(65) Prior Publication Data

US 2014/0111444 A1    Apr. 24, 2014

(51) Int. Cl.
| G06F 3/044 | (2006.01) |
| G06F 3/041 | (2006.01) |
| H03F 3/08  | (2006.01) |
| H03F 3/45  | (2006.01) |
| G06F 3/042 | (2006.01) |

(52) U.S. Cl.
CPC ............. *G06F 3/041* (2013.01); *H03F 3/08* (2013.01); *H03F 3/45475* (2013.01); *G06F 3/0421* (2013.01); *H03F 2203/45261* (2013.01); *H03F 2203/45408* (2013.01); *H03F 2203/45512* (2013.01); *H03F 2203/45521* (2013.01); *H03F 2203/45526* (2013.01); *H03F 2203/45528* (2013.01); *H03F 2203/45536* (2013.01); *H03F 2203/45618* (2013.01)

(58) Field of Classification Search
CPC ....................................................... G06F 3/041

USPC .................................................. 345/173, 175
See application file for complete search history.

(56) References Cited

U.S. PATENT DOCUMENTS

| 4,195,233 A * | 3/1980 | Udvardi-Lakos ..... H02M 7/517 307/66 |
| 5,994,916 A * | 11/1999 | Hayashi ................ G02F 1/1309 324/500 |
| 2002/0101270 A1 * | 8/2002 | Nishizono ............... H03F 3/087 327/205 |
| 2003/0034742 A1 * | 2/2003 | Chang ................ H05B 33/0818 315/224 |
| 2007/0001939 A1 * | 1/2007 | Hashimoto .......... G09G 3/3233 345/76 |

(Continued)

*Primary Examiner* — Jennifer Mehmood
*Assistant Examiner* — Carl Adams
(74) *Attorney, Agent, or Firm* — Lawrence J. Bassuk; Charles A. Brill; Frank D. Cimino

(57) ABSTRACT

An apparatus is provided. There is an input terminal that is configured to receive an input signal from a optical receiver and an output terminal. First and second integrators are coupled between the input and output terminals. In the second integrator, there is a current source that is coupled to the input terminal, a first resistor that is coupled to the output terminal, and a second resistor. Also, there is an amplifier having a first input, a second input, and an output, where the first resistor is coupled to the first input of the amplifier and where the second input of the amplifier is configured to receive a reference voltage. A transistor is coupled between the current source the second resistor and is coupled to the output of the amplifier at its gate. A capacitor is also coupled between the first input of the amplifier and the second resistor.

8 Claims, 4 Drawing Sheets

(56) References Cited

U.S. PATENT DOCUMENTS

| | | | |
|---|---|---|---|
| 2008/0100593 A1* | 5/2008 | Skillman | G06F 3/042 345/175 |
| 2009/0153519 A1* | 6/2009 | Suarez Rovere | G06F 3/0421 345/173 |
| 2009/0183015 A1* | 7/2009 | Song | G06F 1/3203 713/320 |
| 2010/0117719 A1* | 5/2010 | Matano | H02M 3/073 327/536 |
| 2011/0157095 A1* | 6/2011 | Drumm | G06F 3/0421 345/175 |

* cited by examiner

FEEDBACK INTEGRATOR CURRENT SOURCE, TRANSISTOR, AND RESISTOR COUPLED TO INPUT

TECHNICAL FIELD

The invention relates generally to an analog front end (AFE) and, more particularly, to an AFE for a multichannel infrared (IR) sensor system.

BACKGROUND

Touch screens or panels have become commonplace, being used extensively with tablet computers and smart phones, and these touch panels employ a wide variety of sensing technologies (e.g., resistive and capacitive touch panels). One such technology, namely IR sensing, can be seen in FIG. 1. In FIG. 1, the system 100 generally comprises a touch panel 102 that is typically secured to a housing (which has been omitted here for the sake of simplicity of illustration) that determines touch locations in the touch area 104 (which can, for example, include a liquid crystal display or LCD) by use of interference.

In operation, the controller 110 controls the driver 114 such that the transmitter 106 is able to generate IR beams over the touch area 104. As shown, the transmitter 106 (which generally comprises optical transmitter elements that can be IR light emitting diodes arranged along a portion of the periphery of the touch area 104 in this example. Located along a portion of the periphery and opposite the transmitter 106 is a receiver 108 that generally includes optical receiver elements (which can be photodiodes with each photodiode being aligned with at least one of the optical transmitter elements or IR light emitting diodes). These companion optical transmitter/optical receiver elements can be arranged to form a rectangular coordinate system such that each location within the touch area can be identified (with reasonable accuracy) to a horizontal and vertical position. As a result, the controller 110 can cause the driver 114 to "scan through" the optical transmitter elements. When an object (e.g., finger) that is opaque to IR is placed within the optical path of the companion optical transmitter/optical receiver elements, the beams (i.e., corresponding to the vertical and horizontal positions) are blocked. In synchronization with the driver 114, the controller 110 can cause the multiplexer 116 in AFE 120 select the appropriate optical receiver element so as to detect the blockage within the touch area 104. The photocurrents generated by the optical receiver elements in receiver 108 can then be converted to voltages with current-to-voltage (I2V) converter 118, and this information can be passed through the controller 110 (which can be a microcontroller) to the host 112 (which can, for example, be an applications processor within a mobile device).

Of interest here is the I2V converter 118, and an example configuration for the I2V converter 118 (which is labeled 118-A) can be seen in FIG. 2. In this example, amplifier 202 (which receives reference voltage REF1) along with resistor R1 and capacitor C1 function as a transimpedance amplifier, receiving a current pulse from one of the optical receiver elements through multiplexer 116. Amplifier 204 along with resistors R2 to R5 and capacitors C2 and C3 can function both as a filter (e.g., attenuate low frequency interference) and to compensate for leakage current (i.e., so as to not saturate amplifier 202 due to background light). Whenever multiplexer 116 is switched (as shown in FIG. 3), amplifier 204 should settle to a "new" leakage level, which may, for example, vary because the behavior of each optical receiver element varies or because of environmental conditions. This means that the loop bandwidths should be well above the biquad center frequency (e.g., about 1 MHz) to obtain rapid settling and that the gain bandwidth of amplifier 202 can be severely limited by the ratio of resistors R1 and R2. This ratio can also directly affect the settling speed (which is important as it relates directly to the scanning speed for touch detection) as it determines the feedback factor of the amplifier 202. Because resistor R2 is generally set by the bias photocurrent that should be sunk and because the resistor R1 is generally used to set receiver transresistance, this ratio tends to be large, indicating that amplifier 202 should be a fast amplifier. Additionally, the photocurrent can be several orders of magnitude larger than the received pulse, so, to receive a weak signal, amplifier 202 must have a high gain and settling of the photocurrent is significantly reduced due to saturation of amplifier 202.

In an alternative configuration (which is labeled 118-B in FIG. 4), the I2V converter 118-B employs cascaded front and back ends. In the front, amplifier 302 (which uses resistor R6) is coupled to multiplexer 116 and receives reference voltage REF2. From this configuration, it can be seen that there is no resistive loading at the input, meaning that amplifier 302 can be slower than, for example, amplifier 202 of FIG. 2. Feedback, in this example, can be accomplished through the use of automatic gain control (AGC) circuit 308 and current source 310 (which is usually a feedback transconductor implemented as a MOS transistor). The backend generally comprises amplifiers 304 and 306 (which each generally receive reference voltage REF3) that are cascaded with one another and employ resistors R7 and R8 and capacitors C4 to C7. A problem with this configuration is that the front end loop bandwidth varies depending on the photocurrent, meaning that it is difficult to stabilize. Moreover, there is a parasitic pole due to the transconductor control node that can negatively impact stability and settling speed.

Therefore, there is a need for an improved method and/or apparatus.

Some examples of conventional systems are: U.S. Pat. No. 8,031,094; U.S. Patent Pre-Grant Publ. No. 2009/0189878; U.S. Patent Pre-Grant Publ. No. 2011/0063154; U.S. Patent Pre-Grant Publ. No. 2012/0176343; U.S. Patent Pre-Grant Publ. No. 2012/0188205; U.S. Patent Pre-Grant Publ. No. 2012/0188206; and PCT Publ. No. WO2011066100.

SUMMARY

In accordance with an example embodiment of the present invention, an apparatus is provided. The apparatus comprises an input terminal that is configured to receive an input signal from a optical receiver; an output terminal; a first integrator that is coupled between the input and output terminals; and a second integrator having: a current source that is coupled to the input terminal; a first resistor that is coupled to the output terminal; a second resistor; an amplifier having a first input, a second input, and an output, wherein the first resistor is coupled to the first input of the amplifier, and wherein the second input of the amplifier is configured to receive a reference voltage; a transistor that is coupled between the current source the second resistor and that is coupled to the output of the amplifier at its gate; and a capacitor that is coupled between the first input of the amplifier and the second resistor.

In accordance with an example embodiment of the present invention, the capacitor further comprises a first capacitor, and wherein the apparatus further comprises a second capacitor that is coupled to the output of the amplifier.

In accordance with an example embodiment of the present invention, the apparatus further comprises: a first switch that is coupled between the input terminal and the first integrator; and a second switch that is coupled between the output terminal and the first resistor.

In accordance with an example embodiment of the present invention, the apparatus further comprises: a third switch that is coupled to the second input of the amplifier and that is configured to receive the reference voltage; and a fourth switch that is coupled between the second input of the amplifier and the current source; and a fifth switch that is coupled to the first input terminal of the amplifier and that is configured to receive the reference voltage.

In accordance with an example embodiment of the present invention, the fourth and fifth switches are closed during a first mode, and wherein the first, second, and third switches are closed during a second mode.

In accordance with an example embodiment of the present invention, the transistor is an NMOS transistor.

In accordance with an example embodiment of the present invention, an apparatus is provided. The apparatus comprises a touch panel having: a touch area; a transmitter located along a first portion of the periphery of the touch area, wherein the transmitter includes a plurality of optical transmitter elements; and a receiver located along a second portion of the periphery of the touch area, wherein the receiver includes a plurality of optical receiver elements, wherein each optical receiver element is substantially aligned with at least one of the optical transmitter elements; a driver that is coupled to the transmitter; a controller that is coupled to the driver; and an analog front end (AFE) that is coupled between the receiver and the controller, wherein the AFE is configured to receive input signal from each of the plurality of optical receiver elements, and wherein the AFE includes a current-to-voltage (I2V) converter having: an input terminal; an output terminal; a first integrator that is coupled between the input and output terminals; and a second integrator having: a current source that is coupled to the input terminal; a first resistor that is coupled to the output terminal; a second resistor; an amplifier having a first input, a second input, and an output, wherein the first resistor is coupled to the first input of the amplifier, and wherein the second input of the amplifier is configured to receive a reference voltage; a transistor that is coupled between the current source the second resistor and that is coupled to the output of the amplifier at its gate; and a capacitor that is coupled between the first input of the amplifier and the second resistor.

In accordance with an example embodiment of the present invention, the AFE further comprises a multiplexer that is coupled to each optical receiver element and that is coupled to the I2V converter.

In accordance with an example embodiment of the present invention, the amplifier further comprises a first amplifier, and wherein the first integrator further comprises: a third resistor; a third capacitor; a second amplifier having a first input, a second input, and an output, wherein the third resistor and third capacitor are coupled between the first input and the output of the amplifier, and wherein the second input of the amplifier is configured to receive the reference voltage.

In accordance with an example embodiment of the present invention, the plurality of optical transmitter elements further comprises a plurality of infrared (IR) light emitting diodes.

In accordance with an example embodiment of the present invention, the plurality of optical receiver elements further comprises a plurality of photodiodes.

In accordance with an example embodiment of the present invention, an apparatus is provided. The apparatus comprises a touch panel that is secured to a housing, wherein the touch panel includes: a liquid crystal display (LCD) touch area; a transmitter having a plurality of IR laser diodes located along a first portion of the periphery of the LCD touch area; and a receiver having a plurality of photodiodes located along a second portion of the periphery of the LCD touch area, wherein each photodiode is substantially aligned with at least one of the IR light emitting diodes; a driver that is coupled to each IR laser diode; a host; a controller that is coupled to the driver and the host; and an AFE having: a multiplexer that is coupled to each photodiode; and an I2V converter having: an input terminal that is coupled to the multiplexer; an output terminal that is coupled to the controller; a current source that is coupled to the input terminal; a first switch that is coupled to the input terminal; a first amplifier having a first input, a second input, and an output, wherein the first input of the first amplifier is coupled to the first switch, and wherein the output of the first amplifier is coupled to the output terminal, and wherein the second input of the first amplifier is configured to receive a reference voltage; a first resistor that is coupled between the first input and the output of the first amplifier; a first capacitor that is coupled between the first input and the output of the first amplifier; a second switch that is coupled to the output terminal; a second amplifier having a first input, a second input, and an output; a second resistor that is coupled between the second switch and the first input of the second amplifier; a third switch that is configured to receive the reference voltage and that is coupled to the first input of the second amplifier; a fourth switch that is configured to receive the reference voltage and that is coupled the second input of the second amplifier; an NMOS transistor that is coupled to the current source at its drain and the output of the second amplifier at its gate; a third resistor that is coupled between the source of the NMOS transistor and ground; a second capacitor that is coupled between the output terminal of the second amplifier and ground; a third capacitor that is coupled between the first input terminal of the second amplifier and the source of the NMOS transistor; and a fifth switch that is coupled between the second input of the amplifier and the drain of the NMOS transistor.

In accordance with an example embodiment of the present invention, the third and fifth switches are closed during a precharge mode, and wherein the first, second, and fourth switches are closed during normal mode.

In accordance with an example embodiment of the present invention, the controller is a microcontroller.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
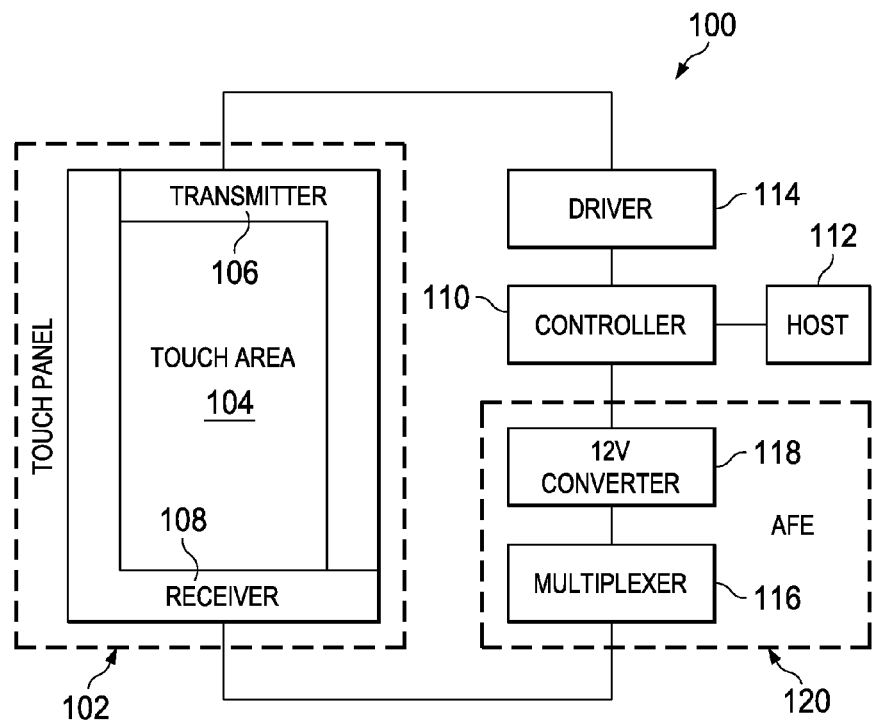
FIG. 1 is a diagram of an example of a conventional system employing IR detection.

Refer now to the drawings wherein depicted elements are, for the sake of clarity, not necessarily shown to scale and wherein like or similar elements are designated by the same reference numeral through the several views.

Figure 2:
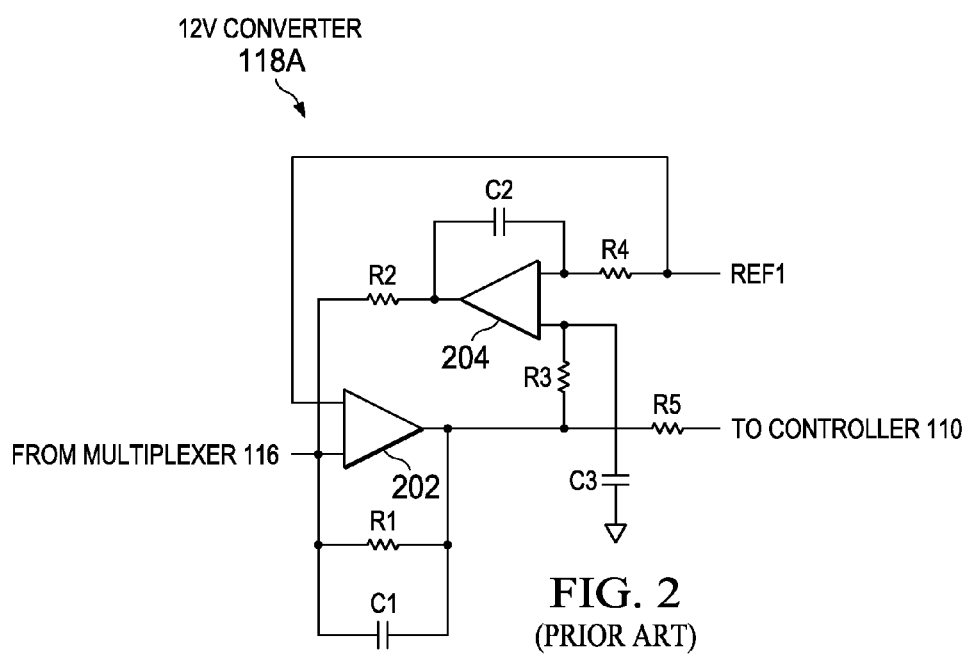
FIGS. 2 and 4 are diagrams of examples of the I2V converter of FIG. 1.
Figure 3:
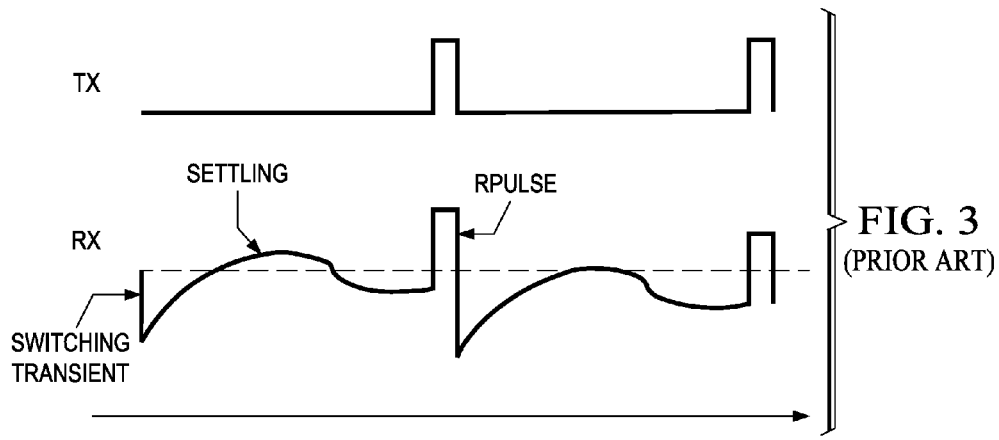
FIG. 3 is a timing diagram for the I2V converter of FIG. 2.

As discussed above with respect to FIG. 2, there are multiple issues with this configuration (e.g., saturation of amplifier 202 due to a large photocurrent change when switching between channels). One approach to compensate for some of these issues (an example of which can be seen in FIG. 5 and which is labeled 400-A) is to implement a precharge mode. Typically, this prechage mode can be implemented by use of switches S1 to S3 that are activated, for example, when precharge signal PC is high (PC) or low (xPC). As shown in the example of FIG. 6, when the multiplexer 116 switches between optical receiver elements, precharge signal PC becomes logic high, causing switch S2 to close and switches S1 and S3 to open. At this time, amplifier 202 is effectively isolated from the input. This allows the reference voltage REF1 to be applied to resistor R2 during this transient period to precharge capacitors C2 and C3. By setting the voltages on (or precharging) capacitors C2 and C3 so that when a measurement is taken following the transient period (e.g., when precharge signal becomes logic low so as to cause switches S1 and S3 to close and switch S2 to open), the output of amplifier 204 is set such that resistor R2 can sink the photocurrent. This results in there being little to no change in the voltage across resistor R2 when the converter 400-A is switched from precharge mode to normal mode.

Figure 5:
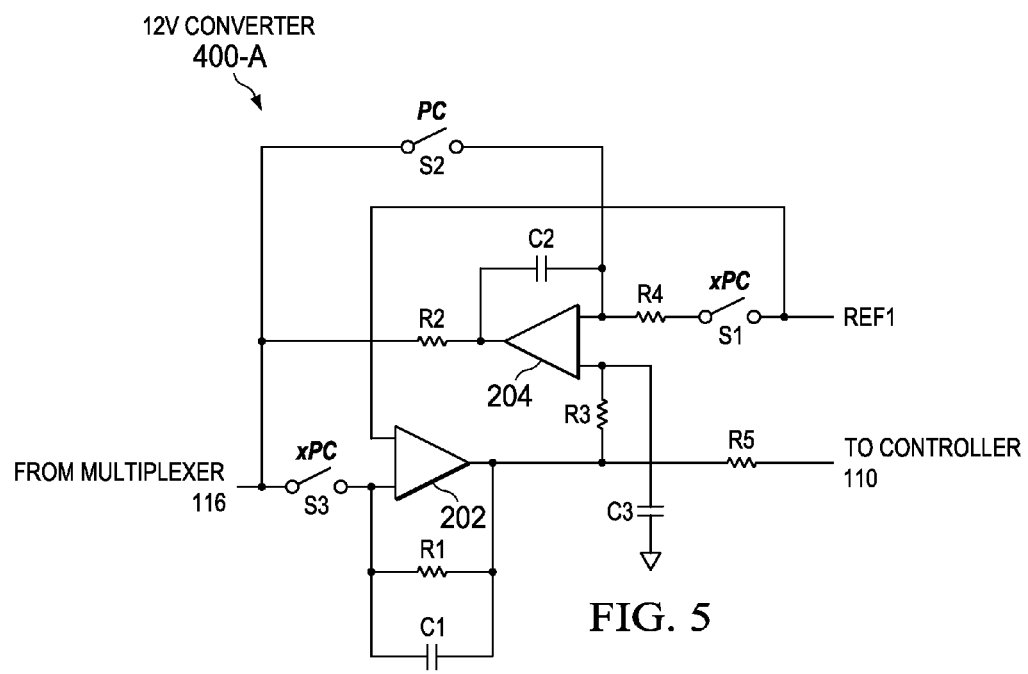
FIG. 5 is a diagram of an example of the I2V converter of FIG. 2 employing a precharge mode.
Figure 6:
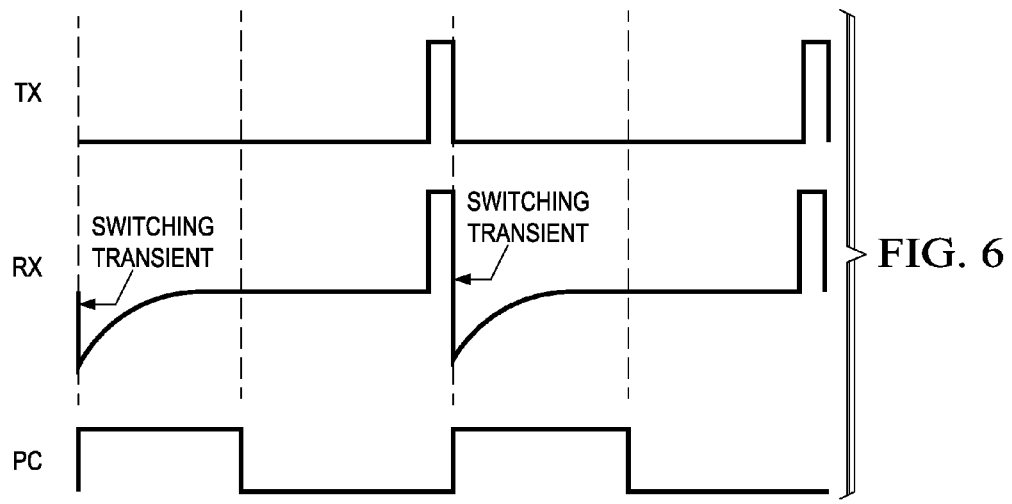
FIG. 6 is a timing diagram for the I2V converter of FIG. 5.
Figure 7:
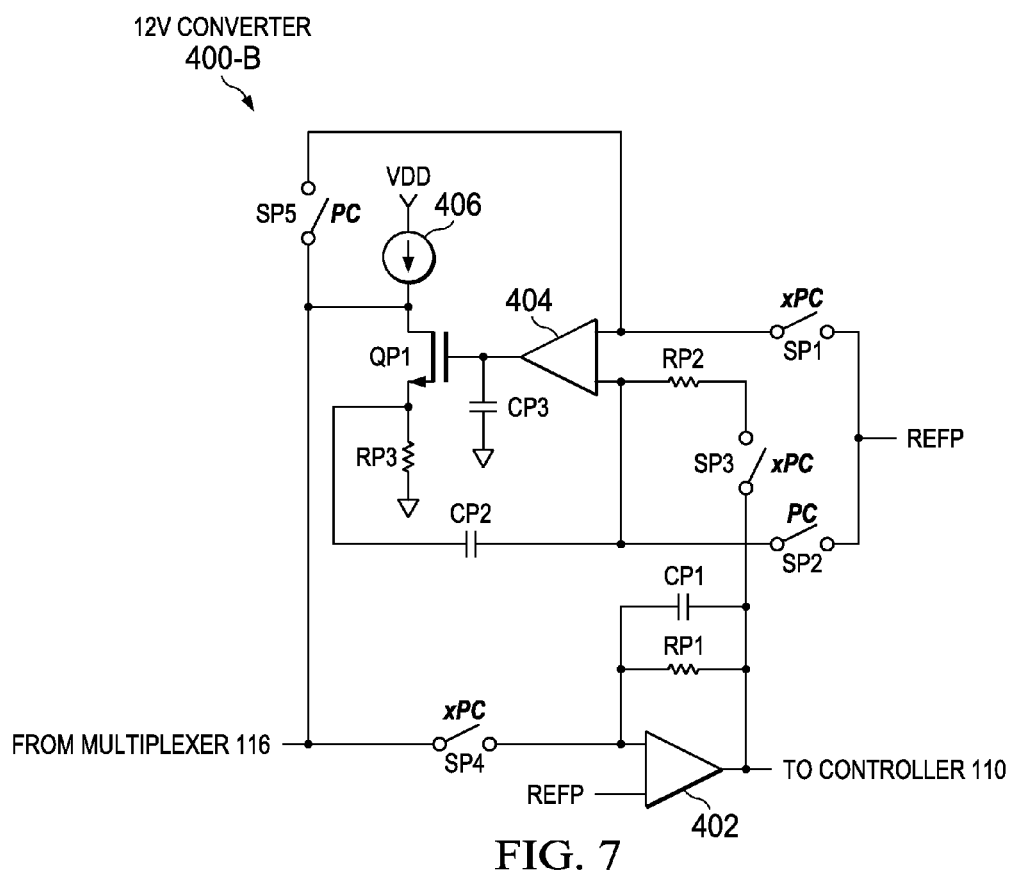
FIG. 7 is a diagram of an example of an I2V converter.

This configuration shown in FIG. 5, while advantageous, can be further improved upon with the I2V converter (which is labeled 400-B) shown in FIG. 7. As shown in this example, the main signal path (between the input and output terminals of I2V converter 400-B) includes an integrator (which is generally comprised of amplifier 402, resistor RP1, and capacitor CP2), and the feedback path includes a feedback integrator (which generally comprises amplifier 404, resistors RP2 and RP3, capacitors CP2 and CP3, transistor QP1, and current source 406). Each of these integrators receives reference voltage REFP, and the feedback integrator obtains a feedback as a current sense (e.g., through resistor RP2) from the output terminal of the converter 400-B. Practically speaking, the signal the feedback integrator senses is the output voltage of amplifier 402, and the feedback forces the DC output voltage of amplifier 402 to be substantially equal to reference voltage REFP. Specifically, in this example configuration, the amplifier 404 is employed to control current applied to the input terminal of converter 400-B by controlling the gate of transistor QP1 (which can, for example, be an NMOS transistor) so as to generally avoid loading (resistive or otherwise) on the input (similar to converter 118-B) but introducing some noise from current source 406, resulting in (parasitics aside) unity gain feedback. Additionally, in this example configuration, the value of resistor RP3 (which can, for example, be a MOS transistor in triode region or any other nonlinear resistive element) and level of reference voltage REFP can set a maximum current that can be sunk. This allows the feedback integrator in this example to function as a linear filter where the response and stability are independent of the bias on the photocurrent.

Figure 4:
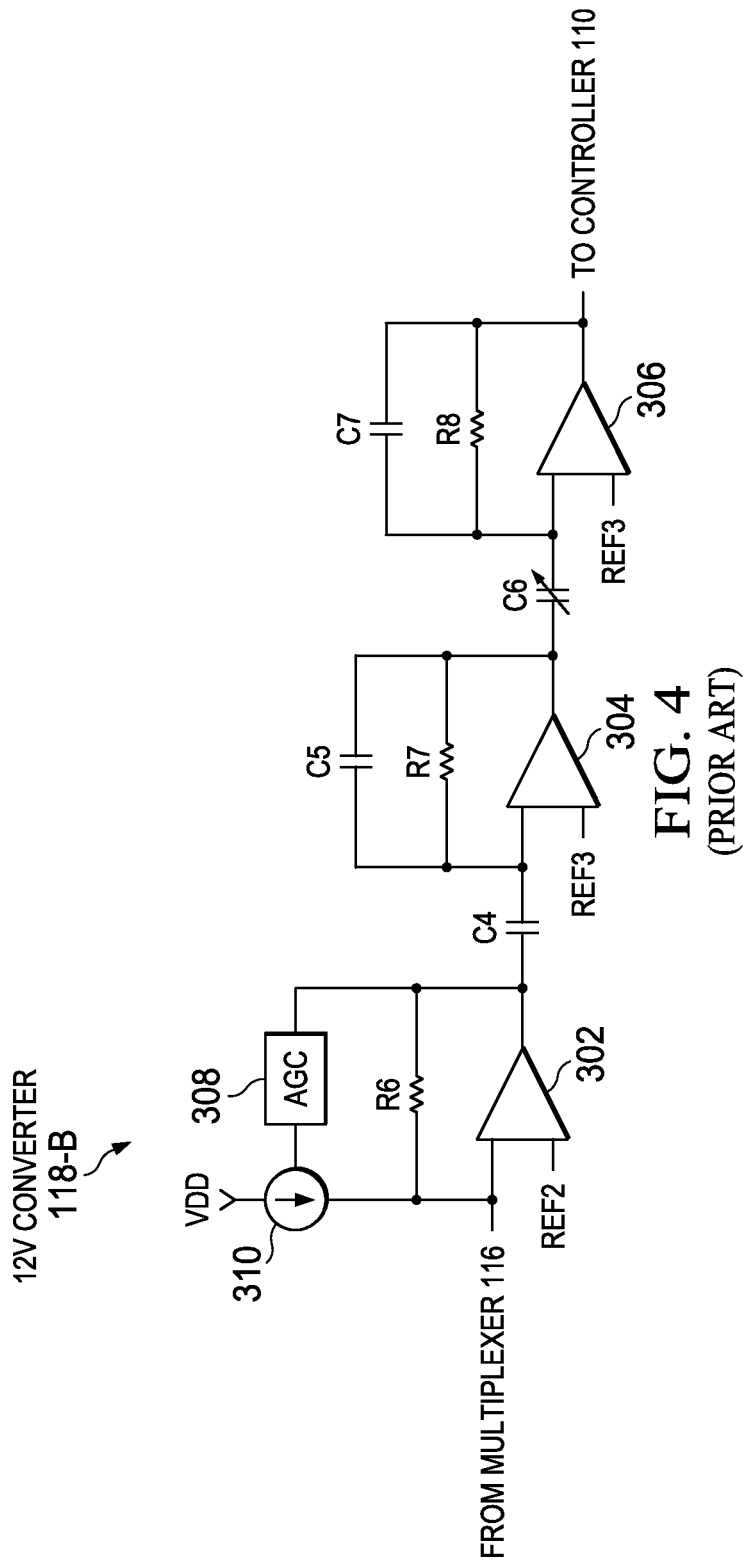

When contrasted with converter 118-B in FIG. 4, though, there are some differences. Although transistor QP1 and resistor RP3 in converter 400-B can be seen as a transconductor, transistor QP1 and resistor RP3 are part of the local feedback via amplifier 404. This shifts the pole due to capacitor CP3 up in frequency so that the pole becomes less problematic. Effectively, amplifier 404, capacitors CP3 and CP2, transistor QP1, and resistor RP3 can form an operational amplifier that is connected as an integrator with output at the source of transistor QP1. With this in mind, capacitor CP3 can set the dominant pole of this operational amplifier, and the feedback due to capacitor CP2 shifts the pole close to the operational amplifier's gain bandwidth. Since the output should to be current, it is obtained as a supply current sense from the operational amplifier's output stage formed by transistor QP1 and resistor RP3. Thus, the transformation is almost intrinsic and does not slow down the integrator (in the main signal path of converter 400-B) as does converter 118-B. A drawback, however, is that transistor QP1 can require some voltage headroom and amplifier current source 406 does generate some extra noise.

Similar to FIG. 5, converter 400-B can also include switches (e.g., switches SP1 to SP5) that can enable a precharge mode. When the multiplexer 116 switches between optical receiver elements, precharge signal PC can become logic high, causing switches SP2 and SP5 to close and switches SP1, SP3, and SP4 to open. At this time, the lossy integrator in the main signal path or transimpedance amplifier (TIA) is effectively isolated from the input, and reference voltage REFP is applied to amplifier 404. This causes capacitors CP2 and CP3 to be precharged using the reference voltage REFP. Once precharged, switches SP2 and SP5 can be opened, and switches SP1, SP3, and SP4 can be closed so as to enable a normal mode of operation. Because of the precharging of capacitors CP2 and CP3, a photocurrent flowing from the input will continue to be sunk by transistor QP1 during normal mode, which generally avoids saturating the TIA and allows it to receive the current related to transmitted light pulse.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A current to voltage converter circuit for a multichannel infrared touch sensor system comprising:
   (a) a converter input lead carrying a current signal:
   (b) a converter output lead carrying a voltage signal:
   (c) a reference voltage lead;
   (d) a first amplifier having a first input, a second input connected to the reference voltage lead, and an output connected to the converter output lead;
   (e) a second amplifier having a first input, a second input, and an output coupled to the converter input lead;
   (f) a first switch coupling the reference voltage lead to the first input of the second amplifier;

(g) a second switch coupling the reference voltage lead to the second input of the second amplifier;
(h) a third switch connecting the converter output lead to the second input of the second amplifier;
(i) a fourth switch coupling the converter input lead to the first input of the first amplifier; and
(j) a fifth switch coupling the converter input lead to the first input of the second amplifier.

2. The circuit of claim 1 in which each switch has a precharge signal input, the first, third, and fourth switches are active when the precharge signal is low, and the second and fifth switches are active when the precharge signal is high.

3. The circuit of claim 1 including a resistor and a capacitor connected in parallel between the first input and the output of the first amplifier.

4. The circuit of claim 1 including a resistor between the third switch and the second input of the second amplifier.

5. The circuit of claim 1 including a current source having an output, a transistor connected between the output of the current source and a circuit ground and having a control input, the converter input lead being connected to the output of the current source, and the output of the second amplifier being connected to the control input of the transistor.

6. The circuit of claim 5 including a resistor connected between the transistor and circuit ground.

7. The circuit of claim 5 including a capacitor connected from between the transistor and circuit ground to the second input of the second amplifier.

8. The circuit of claim 1 including:
(a) a touch panel having a touch area, a transmitter having a transmitter input lead, and a receiver having a receiver output lead;
(b) a multiplexer having an input connected to the receiver output lead and a multiplexer output lead connected to the converter input lead;
(c) a controller having an input connected to the converter output lead and a controller output lead;
(d) a driver having an input connected to the controller output lead and an output connected to the transmitter input.

* * * * *